(12) United States Patent
Rowell

(10) Patent No.: US 11,782,082 B2
(45) Date of Patent: Oct. 10, 2023

(54) OVER-THE-AIR MEASUREMENT SYSTEM AND METHOD OF TESTING A DEVICE UNDER TEST OVER-THE-AIR

(71) Applicant: Rohde & Schwarz GmbH & Co. KG, Munich (DE)

(72) Inventor: Corbett Rowell, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 195 days.

(21) Appl. No.: 17/157,711

(22) Filed: Jan. 25, 2021

(65) Prior Publication Data

US 2022/0236310 A1    Jul. 28, 2022

(51) Int. Cl.
   *G01R 29/10* (2006.01)
   *G01R 29/08* (2006.01)
   *H01Q 19/19* (2006.01)

(52) U.S. Cl.
   CPC ....... *G01R 29/105* (2013.01); *G01R 29/0878* (2013.01); *H01Q 19/192* (2013.01)

(58) Field of Classification Search
   CPC .. G01R 29/0878; G01R 29/105; G01R 29/10; G01R 29/08; H01Q 19/192
   See application file for complete search history.

(56) References Cited

U.S. PATENT DOCUMENTS

| | | | |
|---|---|---|---|
| 10,536,228 B2 * | 1/2020 | Rowell | H04B 17/0085 |
| 10,763,979 B2 * | 9/2020 | Maruo | H01Q 15/14 |
| 2010/0109932 A1 | 5/2010 | Liu | |

(Continued)

FOREIGN PATENT DOCUMENTS

| | | | | |
|---|---|---|---|---|
| DE | 102017122443 A1 * | 3/2019 | | |
| EP | 3828558 A1 * | 6/2021 | ......... | G01R 29/0871 |

(Continued)

OTHER PUBLICATIONS

Rowell, C. et al., "Multiple CATR Reflector System for Multiple Angles of Arrival Measurements of 5G Millimeter Wave Devices," IEEE Access Special Section on Challenges and Endeavors of Radiated Radio Frequency Tests for 5G Radios; vol. 8, 2020, pp. 211324-211334.

(Continued)

*Primary Examiner* — Ab Salam Alkassim, Jr.
*Assistant Examiner* — Anh N Ho
(74) *Attorney, Agent, or Firm* — CHRISTENSEN O'CONNOR JOHNSON KINDNESS PLLC

(57) ABSTRACT

An over-the-air (OTA) measurement system for testing a device under test, with a plurality of feed antennas, a test location for the device under test, and a reflector array with a main reflector and a sub-reflector. The plurality of feed antennas face the sub-reflector. The reflector array is located such that a signal path is established between the plurality of feed antennas and the test location via the sub-reflector and the main reflector. The sub-reflector has at least one focal point. The plurality of feed antennas include a first feed antenna and at least one second feed antenna. The first feed antenna is associated with the focal point of the sub-reflector. The at least one second feed antenna is located offset from the focal point of the sub-reflector. Further, a method of testing a device under test over-the-air is described.

18 Claims, 2 Drawing Sheets

(56) References Cited

U.S. PATENT DOCUMENTS

| | | |
|---|---|---|
| 2014/0313080 A1 | 10/2014 | Smith et al. |
| 2019/0036621 A1* | 1/2019 | Vanwiggeren ....... H04B 17/354 |
| 2019/0199002 A1 | 6/2019 | Rowell et al. |
| 2019/0215085 A1* | 7/2019 | Rowell .................. H04B 17/15 |
| 2020/0217885 A1* | 7/2020 | Rowell .............. G01R 31/3025 |

FOREIGN PATENT DOCUMENTS

| | | | |
|---|---|---|---|
| WO | WO-8606550 A * | 11/1986 | ........... H01Q 17/001 |
| WO | WO-2021204949 A1 * | 10/2021 | ............. G01R 29/10 |

OTHER PUBLICATIONS

Wu, J., et al. "Design of Ring-Focus Elliptical Beam Reflector Antenna," International Jorumal of Antennas and Propagation; Jan. 4, 2016, vol. 16; Article ID 9615064: 7 pages.

* cited by examiner

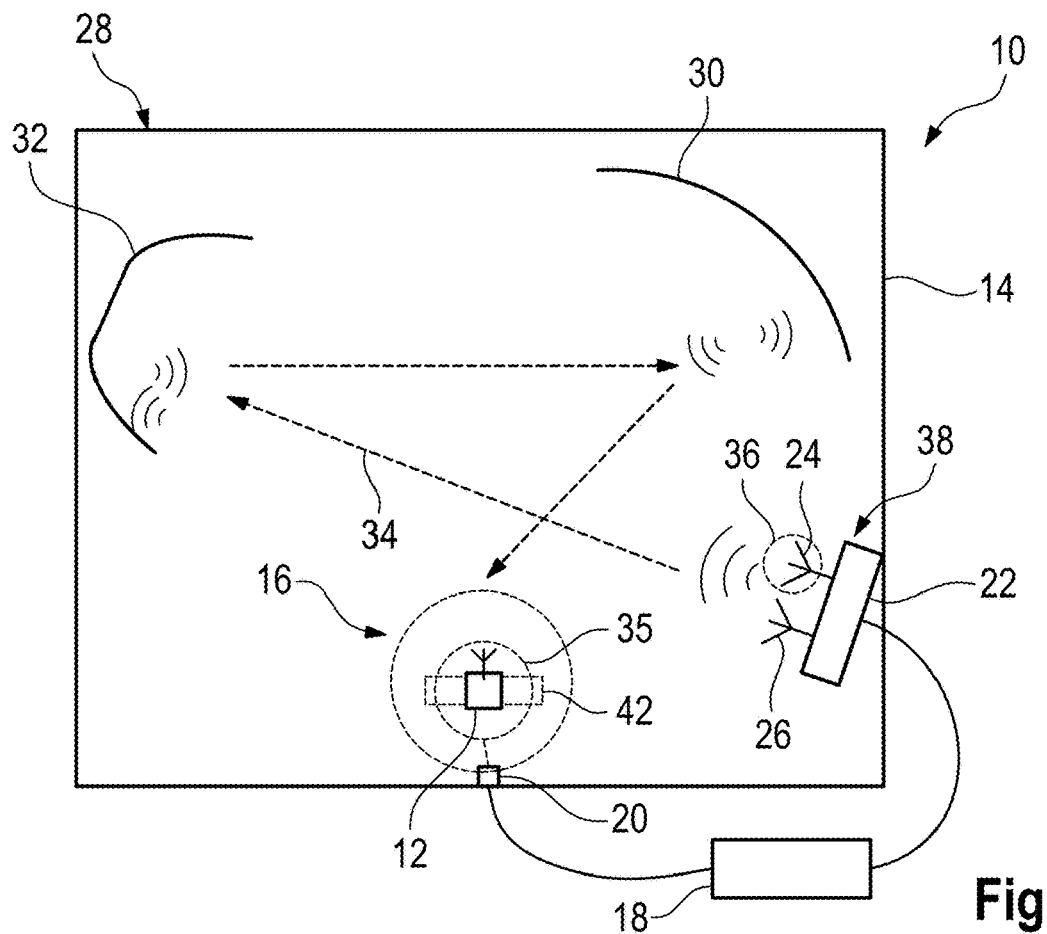
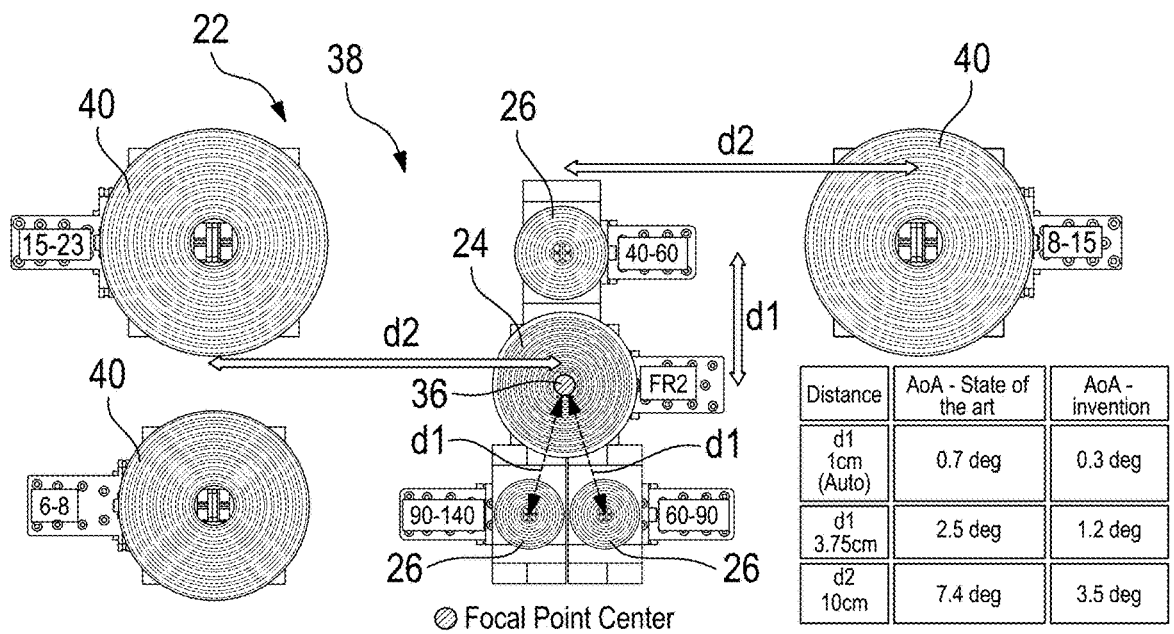
Fig. 2

OFFSET FIELD DISTRIBUTIONS: FR2 CO-POL RMS

OFFSET FIELD DISTRIBUTIONS: FR2 X-POL RMS

OVER-THE-AIR MEASUREMENT SYSTEM AND METHOD OF TESTING A DEVICE UNDER TEST OVER-THE-AIR

FIELD OF THE DISCLOSURE

Embodiments of the present disclosure generally relate to an over-the-air (OTA) measurement system for testing a device under test. Further, embodiments of the present disclosure relate to a method of testing a device under test over-the-air.

BACKGROUND

In the state of the art, over-the-air (OTA) measurement systems for testing a device under test are known. Typically, so-called compact antenna test ranges (CATR) are used to test the respective device under test, wherein the compact antenna test range has a testing chamber, e.g. an anechoic chamber, in which the device under test is placed for testing purposes. The measurement system typically provides a quiet zone within the testing chamber, which is associated with a testing location of the device under test. At least one reflector is used that is located in a beam path established between the test location and a respective antenna in order to increase the traveling distance of the electromagnetic waves, thereby ensuring far-field conditions at the test location, which relates to the quiet zone.

The device under test may relate to a modern communication device, for instance a user end device such as a mobile phone. Modern communication devices use telecommunication standards having large frequency bandwidths. Therefore, the respective measurement systems have to cover the entire frequency range for testing purposes, which may be used by the device under test. In other words, the measurement system has to cover a large frequency range. Usually, multiple feed antennas are located inside the chamber of the measurement system in order to cover the respective frequency range. For instance, the wide band operation is necessary for testing the device under test with respect to (telecommunication) standards like 3GPP, CTIA and/or FCC.

For testing the respective standards, the reflector typically provides sufficient operational bandwidth, but the feed antenna used has constraints. In some embodiments, the feed antenna has to have characteristics such as a stable phase center, low sidelobes and stable beamwidth which in turn result in a narrow bandwidth of the feed antennas.

Accordingly, it is necessary to provide several different feed antennas for covering the frequency range at which the respective device under test is tested. One solution relates to mounting multiple feed antennas to a positioner that moves each feed antenna in to the phase center, resulting in optimal quiet zones respectively. However, the positioner is necessary which increases the costs of the measurement system.

Alternatively, it is known to use offset feed antennas, namely feed antennas located offset. Thus, at least a second feed antenna is located offset from a focal point of the reflector. However, this results in an angled wave front at the quiet zone, namely the testing location, thereby shifting the quiet zone away from the center. For instance, an offset of about 5 cm results in a 30-100% shift of the quiet zone out of the center. Hence, a positioner is necessary again, wherein the positioner is associated with the device under test in order to re-position the device under test. This ensures that the device under test is always located within the respective quiet zone. However, this solution also requires a positioner that increases the costs of the measurement system.

Accordingly, there is a need for an over-the-air measurement system that can be provided in a cost-efficient manner while ensuring wideband testing of a device under test.

SUMMARY

The present disclosure provides examples of an over-the-air (OTA) measurement system for testing a device under test. In an embodiment, the OTA measurement system comprises a plurality of feed antennas, a test location for the device under test, and a reflector array with a main reflector and a sub-reflector. The plurality of feed antennas face the sub-reflector. The reflector array is located such that a signal path is established between the plurality of feed antennas and the test location via the sub-reflector and the main reflector. The sub-reflector has at least one focal point. The plurality of feed antennas comprises a first feed antenna and at least one second feed antenna. The first feed antenna is associated with the focal point of the sub-reflector. The at least one second feed antenna is located offset from the focal point of the sub-reflector.

Accordingly, a special offset feed antenna arrangement is provided that comprises the at least one second feed antenna located offset with respect to the focal point with which the first feed antenna is associated. In some embodiments, the first feed antenna is located exactly at the focal point or nearby the focal point, namely within unavoidable deviations. However, the at least one second feed antenna is intentionally located offset from the focal point.

In any case, the respective feed antennas of the special offset feed antenna arrangement, namely the first feed antenna and the at least one second feed antenna, are directed towards a dual reflector system comprising the main reflector and the sub-reflector, namely the reflector array.

Hence, off-orthogonal angles can be effectively reduced by about 50% due to the special offset feed antenna arrangement and the reflector array provided. In some embodiments, the at least one second feed antenna can be located offset by a distance comprising up to about 10 cm, up to 10 cm, etc., within the special offset feed antenna arrangement due to the specific reflector array having the main reflector and the sub-reflector.

Generally, this allows to use several feed antennas orientated towards the reflector array while simultaneously ensuring far-field conditions at the (same) test location since the quiet zone is not shifted significantly. In other words, the center of the quiet zone does not move (significantly). Thus, it is not necessary to provide a feed antenna positioner for the feed antenna(s) and/or a positioner for the device under test, as the quiet zone, for example its center, remains substantially stationary, namely at the same location, for example with regard to its center. Accordingly, the quiet zone is not shifted due to the special offset feed antenna arrangement, namely the respective offset arrangement of the at least one second feed antenna.

The plurality of feed antennas may comprise more than one second feed antenna. In some embodiments, several additional feed antennas or rather a set of additional feed antennas may be provided that are directed towards the sub-reflector while being located offset from its focal point. The plurality of feed antennas may relate to a set of second feed antennas that are located offset from the focal point in a substantially similar manner, e.g. by a similar or rather at least comparable distance, namely within a range of ±1 cm.

An aspect provides that the first feed antenna is configured to emit electromagnetic waves in a first frequency band. The at least one second feed antenna is configured to emit electromagnetic waves in a second frequency band. The second frequency band is different from the first frequency band. Hence, a first test signal may be generated by the first feed antenna in a first frequency band. A second test signal is generated by the at least one second feed antenna in a second frequency band. The second frequency band is different from the first frequency band.

Accordingly, the different feed antennas are used to cover a certain frequency sub-range of the entire frequency range to be tested with regard to the device under test. The respective frequency bands associated with the different feed antennas may be complementary.

The first feed antenna may cover a frequency band that is associated with a frequency band associated with 5G-New Radio (5G NR), e.g. Frequency Range 2 (FR2), namely frequencies from 23 GHz up to 53 GHz. In some embodiments, the first feed antenna may be used for FR2 in-band testing at frequencies from 23 GHz to 44 GHz.

The at least one second feed antenna may cover a frequency range from 40 GHz to 200 GHz. In some embodiments, a set of second feed antennas is provided that are located offset from a center at which the first feed antenna is located. The focal point of the sub-reflector and the center may coincide with each other. In some embodiments, the several second feed antennas establishing the set of second feed antennas may each cover different frequency ranges which however together cover the frequency range from 40 GHz to 200 GHz.

According to another aspect, a central frequency of the first frequency band is lower than a central frequency of the second frequency band. For instance, the first feed antenna may cover the frequency band associated with the frequency band FR2 such that its central frequency is about 34 GHz. The central frequency of the at least one second feed antenna may relate to 50 GHz, 115 GHz or rather 75 GHz, for example.

For instance, a set of three second feed antennas is provided, wherein the three different second feed antennas each cover a different frequency range. The set of the second feed antennas together cover a frequency range from 40 to 140 GHz.

In some embodiments, one of the three second feed antennas may cover a frequency range from about 40 to about 60 GHz, another second feed antenna covers a frequency range from about 60 to about 90 GHz and a further second feed antenna covers a frequency range from about 90 to about 140 GHz. Moreover, an optional fourth second feed antenna may be provided that covers a frequency range from about 140 to about 200 GHz. Accordingly, the set of second feed antennas together covers a frequency range from about 40 to about 140 GHz or rather about 40 to about 200 GHz in some embodiments.

Generally, the several second feed antennas are located on a substantially circular ring around the center of the special offset feed antenna arrangement. The center of the special offset feed antenna arrangement is associated with the focal point of the sub-reflector. In other words, the location of the first feed antenna corresponds to the center of the special offset feed antenna arrangement.

The substantially circular ring may have a deviation from a perfect circular ring that amounts to about ±1 cm in some embodiments.

In other words, the several second feed antennas are located on a curve enclosing the center of the special offset feed antenna arrangement by a substantially similar distance, for example the same distance with a deviation of about ±1 cm.

A further aspect provides that the OTA measurement system comprises at least one third feed antenna. The at least one third feed antenna is located offset from the focal point, wherein a distance between the focal point and the at least one third feed antenna is bigger than a distance between the second antenna and the focal point. Thus, the at least one third feed antenna is located more offset with respect to the focal point of the sub-reflector compared with the second feed antenna. Hence, two different kinds of feed antennas are provided that located offset from the focal point in a different manner.

In a similar manner, a set of third feed antennas may be provided. The third feed antennas are located in a substantially similar manner offset from the focal point of the sub-reflector.

In some embodiments, the at least one third feed antenna is configured to emit electromagnetic waves in a third frequency band. The third frequency band is different from the first frequency band and from the second frequency band. Accordingly, the entire feed antenna arrangement ensures that wideband measurements of the device under test can be performed accordingly since different frequency bands are associated with different locations of the different types of feed antennas.

For instance, a central frequency of the second frequency band is higher than a central frequency of the third frequency band. Additionally or alternatively, a central frequency of the first frequency band is higher than a central frequency of the third frequency band. Thus, the third frequency band may be associated with a lower frequency sub-range to be tested.

In some embodiments, the middle portion of the overall frequency range to be tested, namely the frequency band FR2, is associated with the focal point of the sub-reflector, whereas the at least one second feed antenna associated with the higher frequency sub-range to be tested is located offset from the focal point, and whereas the at least one third feed antenna associated with the lower frequency sub-range to be tested is located more offset from the focal point compared to the at least one second feed antenna.

Generally, the several third feed antennas, namely the set of third feed antennas, may be located on a curve that is more distanced from the focal point, namely the center at which the first feed antenna is provided, than a curve associated with the set of second feed antennas, namely the several second feed antennas. The third feed antennas may cover a frequency range from about 6 to about 40 GHz.

The respective curves may be substantially circular rings, thereby ensuring that the respective feed antennas are distanced by a certain radius. However, the curves may also deviate from a perfect circular shape by a certain deviation, e.g. a deviation of about ±1 cm.

In any case, it is ensured that the at least one second feed antenna, for example the several second feed antennas, operated at higher frequencies is located closer to the center of the special offset feed antenna arrangement, namely the focal point of the sub-reflector, compared to the at least one third feed antenna, for example the several third feed antennas operated at lower frequencies.

Generally, the at least one second feed antenna operated at higher frequencies has a smaller antenna aperture compared with the at least one third feed antenna operated at lower frequencies. Since the at least one second feed antenna is located closer to the center of the special offset feed antenna arrangement, namely the focal point of the sub-reflector, than the at least one third feed antenna, it is ensured that the respective offsets from the focal point have a lower impact on a shift of the quiet zone.

Another aspect provides that the main reflector is located between the sub-reflector and the test location. The main reflector faces the test location and the sub-reflector such that the signal path is established between the plurality of feed antennas and the test location via the sub-reflector and the main reflector. Put differently, the feed antennas facing the sub-reflector emit electromagnetic waves that impinge on the sub-reflector that reflects the waves towards the main reflector which in turn reflects the waves towards the test location, thereby establishing the signal path between the plurality of feed antennas and the test location.

Thus, the electromagnetic waves emitted by the plurality of feed antennas is reflected at least twice by the antenna array comprising the main reflector and the sub-reflector. The respective reflectors of the reflector array are shaped differently, thereby ensuring the reflective characteristics required in order to create the quite zone at the test location in the intended manner.

For instance, the sub-reflector facing the plurality of feed antennas is established as a non-paraboloid reflector. For instance, the sub-reflector is established by an ellipsoid or a hyperboloid. Hence, the non-paraboloid reflector, namely the sub-reflector, may have two or more focal points, namely the focal point associated with the first feed antenna and at least one further focal point.

The at least one second feed antenna and/or the at least one third feed antenna may be associated with the at least one further focal point. However, the at least one second feed antenna and/or the at least one third feed antenna is not associated with the focal point at which the first feed antenna is located.

Further, the main reflector being located between the sub-reflector and the test location is established as a paraboloid reflector. The main reflector has only a single focal point that is directed towards the center of the test location or rather the center of the quite zone.

A further aspect provides that the OTA measurement system comprises a positioner for the device under test. The positioner is configured to position the device under test in a predetermined manner within the test location. Therefore, it is still ensured that the device under test can be re-positioned in order to follow a shifted quite zone, thereby ensuring optimum test conditions when performing the OTA measurements. However, the OTA measurement system, for example the feed antenna arrangement, ensures that it is not necessary to re-position the device under test with regard to a large frequency range. In some embodiments, the positioner may comprise one or more linear and/or angular stages.

Further, the OTA measurement system may comprise an RF-shielded chamber. The RF-shielded chamber encloses the plurality of feed antennas, the test location for the device under test, and the reflector array. The RF-shielded chamber relates to a testing chamber of the OTA measurement system, which encompasses the respective components of the OTA measurement system used for testing the device under test. The RF-shielded chamber may also be called anechoic chamber as it is ensured that no interfering signal from the outside interact with the components located in the chamber, thereby ensuring that those signals from the outside do not have an influence or rather impact on the respective measurements performed.

Moreover, the OTA measurement system may comprise measurement equipment. The measurement equipment is configured to conduct OTA measurements. The measurement equipment may be connected with the feed antennas and a test terminal associated with the test location such that a connection can be established with the device under test. Accordingly, it is ensured that the device under test located at the test location can be measured appropriately with regard to its far-field characteristics by controlling the feed antennas appropriately and by evaluating signals received by the measurement equipment. Depending on the test scenario, signals received from the feed antennas or rather signals received from the device under test are evaluated accordingly.

In some embodiments, a quite zone is established by the plurality of feed antennas together with the reflector array. The test location is located within the quite zone. Therefore, it is ensured that the device under test can be tested with regard to its far-field characteristics accurately.

The OTA measurement may comprise a device under test that is located in the test location. Therefore, the OTA measurement system itself may already comprise the device under test.

Embodiments of the present disclosure also provides a method of testing a device under test over-the-air. In an embodiment, the method comprises the steps of:
  providing a device under test;
  providing an OTA measurement system for testing the device under test over-the-air, wherein the OTA measurement system comprises a plurality of feed antennas, a test location for the device under test, and a reflector array with a main reflector and a sub-reflector, the plurality of feed antennas facing the sub-reflector, the reflector array being located such that a signal path is established between the plurality of feed antennas and the test location via the sub-reflector and the main reflector, the sub-reflector having at least one focal point, the plurality of feed antennas comprising a first feed antenna and at least one second feed antenna, the first feed antenna being associated with the focal point of the sub-reflector, and the at least one second feed antenna being located offset from the focal point of the sub-reflector;
  placing the device under test at the test location; and
  performing an over-the-air measurement on the device under test.

The method can be performed by one or more of the OTA measurement systems described above. In some embodiments, the characteristics and advantages mentioned above also apply to the method in a similar manner.

Generally, the special offset feed antenna arrangement may comprise up to 8 feed antennas nested in three different layers, namely the first feed antenna located at the center of the special offset feed antenna arrangement as well as seven feed antennas located offset from the focal point of the sub-reflector, in particular wherein the seven feed antennas located offset from the focal point of the sub-reflector are nested in two different layers, e.g. on two different curves around the center. For instance, four second feed antennas are provided that are located closer to the center than three third feed antennas.

According to an embodiment, an inner curve associated with the second feed antennas is provided that is distanced from the focal point by 3 to 5 cm, for example by 3.75 cm, whereas an outer curve is provided that is distanced from the focal point by 8 to 10 cm, for example by 10 cm, wherein the outer curve is associated with the third feed antennas.

Moreover, the second feed antennas are operated at frequencies higher than the frequencies of the third feed antennas.

Generally, the main reflector may have an edge treatment, thereby improving the reflective properties of the main reflector, for example at its edges.

Further, the sub-reflector may also have an edge treatment in order to also improve its reflective properties in its edge area.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 schematically shows an overview of an over-the-air (OTA) measurement system according to an embodiment of the present disclosure;

FIG. 2 schematically shows a more detailed view on an overview of a special offset feed antenna arrangement used by the over-the-air (OTA) measurement system shown in FIG. 1;

DETAILED DESCRIPTION

Figure 3:
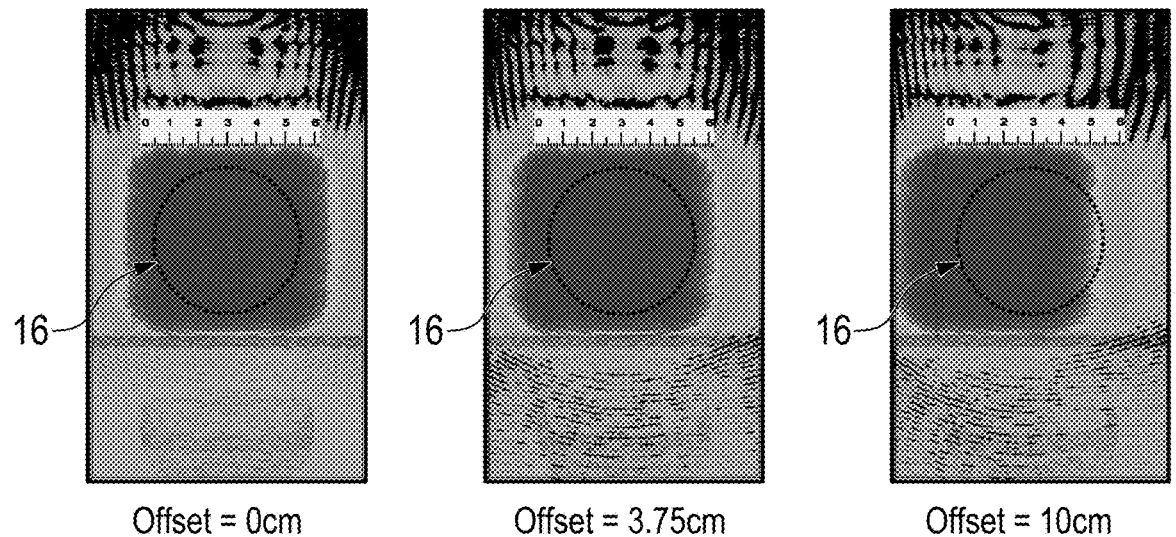
FIG. 3 schematically shows an overview of field distributions for the FR2 co-polarization patterns indicating the influence of the offset on the field distributions.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

FIG. 1 shows an over-the-air (OTA) measurement system 10 for testing a device under test 12. The OTA measurement system 10 comprises a testing chamber 14 established by an RF-shielded chamber so as to shield an interior of the testing chamber 14 from interfering and disturbing signals. In the testing chamber 14, the device under test 12 is located at a test location 16.

The OTA measurement system 10 also comprises measurement equipment 18 that is used for testing the device under test 12. In the shown embodiment, the measurement equipment 18 is connected with a test terminal 20 in order to establish a connection with the device under test 12 so as to receive signals from the device under test 12 that can be evaluated by the measurement equipment 18. The measurement equipment 18 is connected with a feed antenna array 22 that comprises a plurality of feed antennas 24, 26, namely a first feed antenna 24 and at least one second feed antenna 26, as will be described later in more detail when referring to FIG. 2.

The OTA measurement system 10 further includes a reflector array 28 that comprises a main reflector 30 and a sub-reflector 32. As shown in FIG. 1, the reflector array 28, for example its reflectors 30, 32, is arranged within the testing chamber 14 such that a signal path 34 is established between the plurality of feed antennas 24, 26 and the test location 16 via the sub-reflector 32 and the main reflector 30. Accordingly, the sub-reflector 32 and the main reflector 30 together relate to a specific dual-reflector system.

In some embodiments, the feed antennas 24, 26 face the sub-reflector 32 of the reflector array 28 such that electromagnetic waves emitted by the feed antennas 24, 26 impinge on the sub-reflector 32 that reflects the electromagnetic waves towards the main reflector 30 that faces the test location 16. Accordingly, the electromagnetic waves impinging on the main reflector 30 are reflected towards the test location 16, thereby establishing a quiet zone 35 at the test location 16. Hence, the device under test 12 is located within the quiet zone 35 at the test location 16, thereby ensuring far-field conditions for testing purposes.

The sub-reflector 32 facing the plurality of feed antennas 24, 26 has a focal point 36 indicated by the dotted line in FIG. 1. Accordingly, the first feed antenna 24 is associated with the focal point of the sub-reflector 32. In some embodiments, the first feed antenna 24 is located exactly at the focal point 36 or nearby the focal point 36, namely within unavoidable deviations. In contrast thereto, the at least one second feed antenna 26 is located offset from the focal point 36 of the sub-reflector 32. Specifically, the second feed antenna 26 is intentionally located offset from the focal point 36 to which the first feed antenna 24 is assigned.

In the shown embodiment, the sub-reflector 32 is established as a non-paraboloid reflector having a further focal point besides the focal point 36. Hence, the sub-reflector 32 may have more than one focal point. For instance, the sub-reflector 32 is established by an ellipsoid or a hyperboloid.

In contrast thereto, the main reflector 30 located between the sub-reflector 32 and the test location 16 is established as a paraboloid reflector having a single focal point that is associated with the test location 16.

Accordingly, the respective antenna array 22 comprising the several feed antennas 24, 26 relates to a special offset feed antenna arrangement 38 since the at least one second feed antenna 26 is (intentionally) located offset from the reflector on which the electromagnetic waves emitted impinge directly, namely the sub-reflector 32.

An embodiment of the antenna array 22, namely the special offset feed antenna arrangement 38, is shown in more detail in FIG. 2.

The antenna array 22 comprises the first feed antenna 24 associated with the focal point 36 of the sub-reflector 32. In some embodiments, the center of the first feed antenna 24 coincides with the focal point 36. The first feed antenna 24 is configured to emit electromagnetic waves in a first frequency band, namely a frequency band associated with Frequency Range 2 (FR2), e.g. frequencies from 23 GHz up to 53 GHz. In some embodiments, the first feed antenna 24 can be used for FR2 in-band testing of the device under test 12 at frequencies ranging from 23 GHz to 44 GHz.

Furthermore, the antenna array 22, namely the special offset feed antenna arrangement 38, comprises a set of second feed antennas 26 that are distanced from the focal point 36, e.g. the center of the antenna array 22 or rather the special offset feed antenna arrangement 38, by a substantially equal distance labelled by d1. Small deviations from this distance may occur as shown for the lower second feed antennas 26 that are also displaced in horizontal direction by a certain distance.

Alternatively, the lower second feed antennas 26 may be displaced in vertical orientation by a smaller distance than d1 such that all second feed antennas 26 are located on a (perfect) circle around the focal point 36, which has a radius corresponding to distance d1. This is illustrated by the dashed arrows in FIG. 2.

Generally, the second feed antennas 26 together cover a frequency range from 40 GHz to 140 GHz, e.g. one of the second feed antennas 26 covers the frequency range from 40 GHz to 60 GHz, another second feed antenna 26 covers the frequency range from 60 GHz to 90 GHz, and a further second feed antenna 26 covers the frequency range from 90 GHz to 140 GHz.

Optionally, a fourth second feed antenna 26 may be provided that coves a frequency range from 140 GHz to 200 GHz such that all second feed antennas 26 cover a frequency range from 40 GHz to 200 GHz.

Accordingly, the at least one second feed antenna 26, for example each of the second feed antennas 26, is configured to emit electromagnetic waves in a second frequency band that is different from the first frequency band, for example higher than the first frequency band. Accordingly, a central frequency of the first frequency band is lower than a central frequency of the second frequency band.

FIG. 2 also shows that the antenna array 22, namely the special offset feed antenna arrangement 38, has at least one third feed antenna 40 that is also located offset from the focal point 36. A distance between the focal point 36 and the at least one third feed antenna 40 is bigger than the distance between the second antenna 26 and the focal point 36.

In the shown embodiment, a set of third feed antennas 40 is provided, namely three different third feed antennas 40 each covering a different frequency range, namely from 6 GHz to 8 GHz, from 8 GHz to 15 GHz and from 15 GHz to 23 GHz.

Alternatively, a plurality (e.g., four) of the third feed antennas 40 or rather differently designed third feed antennas 40 may be provided, thereby covering a frequency range from 6 GHz to 40 GHz in total.

For instance, the set of third feed antennas 40 may comprise a single third feed antenna 40 that covers a frequency range from 6 GHz to 40 GHz and two additional feed antennas 40 associated with a frequency range from 8 GHz to 15 GHz and from 15 GHz to 23 GHz, respectively.

Accordingly, the at least one third feed antenna 40 is configured to emit electromagnetic waves in a third frequency band that is different from the first frequency band and from the second frequency band. In some embodiments, a central frequency of the second frequency band is higher than a central frequency of the third frequency band. Additionally or alternatively, a central frequency of the first frequency band is higher than a central frequency of the third frequency band. Therefore, the respective feed antennas 24, 26, 40 together cover a frequency range from 6 GHz to 140 GHz or optionally from 6 GHz to 200 GHz.

Accordingly, the different feed antennas 24, 26, 40 are used to cover a certain frequency sub-range of the entire frequency range used for testing the device under test 12. The frequency bands associated with the different feed antennas 24, 26, 40 are complementary, but may overlap slightly.

Generally, the plurality of second feed antennas 26 or rather third feed antennas 40 are located offset from the focal point 36 in a substantially similar manner, e.g. by a similar or rather at least comparable distance, namely within a range of ±1 cm for example.

In some embodiments, the several second feed antennas 26 are located on a substantially circular ring around the center of the special offset feed antenna arrangement 38. However, the substantially circular ring may have a deviation from a perfect circular ring that amounts to about ±1 cm. Thus, the several second feed antennas 26 are located on a curve enclosing the center of the special offset feed antenna arrangement 38 by a substantially similar distance, for example the same distance with a deviation of about ±1 cm. For instance, the curve associated with the second feed antennas 26 has a distance d1 between 3 cm and 4 cm.

The same applies for the several third feed antennas 40 that are also located on a substantially circular ring around the center of the special offset feed antenna arrangement 38. However, the substantially circular ring may have a deviation from a perfect circular ring that amounts to about ±1 cm. Thus, the several third feed antennas 40 are located on a curve enclosing the center of the special offset feed antenna arrangement 38 by a substantially similar distance, for example the same distance with a deviation of about ±1 cm. For instance, the curve associated with the third feed antennas 40 has a distance d2 between 8 cm and 10 cm.

The distance associated with the second feed antennas 26 is smaller than the distance associated with the third feed antennas 40. Hence, the second feed antennas 26 are located closer to the center of the special offset feed antenna arrangement 38 or rather the focal point 36 than the third feed antennas 40.

The second feed antennas 26 are operated at higher frequencies such that their respective apertures are smaller compared to the ones of the third feed antennas 40 that are operated at lower frequencies. Therefore, the second feed antennas 26 are located closer to the center of the special offset feed antenna arrangement 38, thereby providing an overall compact antenna array 22.

Accordingly, the first set of offset feed antennas, namely the second feed antennas 26, is located closer to the center antenna, namely the first feed antenna 24, while operating at higher frequencies (therefore smaller antenna aperture) than the second set of antennas furthest from the center antenna. The second set of antennas furthest from the center antenna correspond to the third feed antennas 40 that are operated at the lowest frequencies of all feed antennas 24, 26, 40 of the antenna array 22.

In FIG. 2, a table is also shown indicating that the specific offset feed antenna arrangement 38 together with the reflector array 28 ensure that a shift of the quiet zone 35 can be neglected compared to systems known in the state of the art since a wavefront of emitted electromagnetic waves is angled by 3.5 degrees in case of an offset of 10° cm for the feed antennas contrary to the prior art resulting in a wavefront angled by 7.4 degrees, requiring a re-positioning of the antenna array 22 and/or the device under test 12 in order to ensure proper testing conditions.

Accordingly, off-orthogonal angles can be effectively reduced by about 50% due to the special offset feed antenna arrangement 38 and the reflector array 28.

Figure 4:
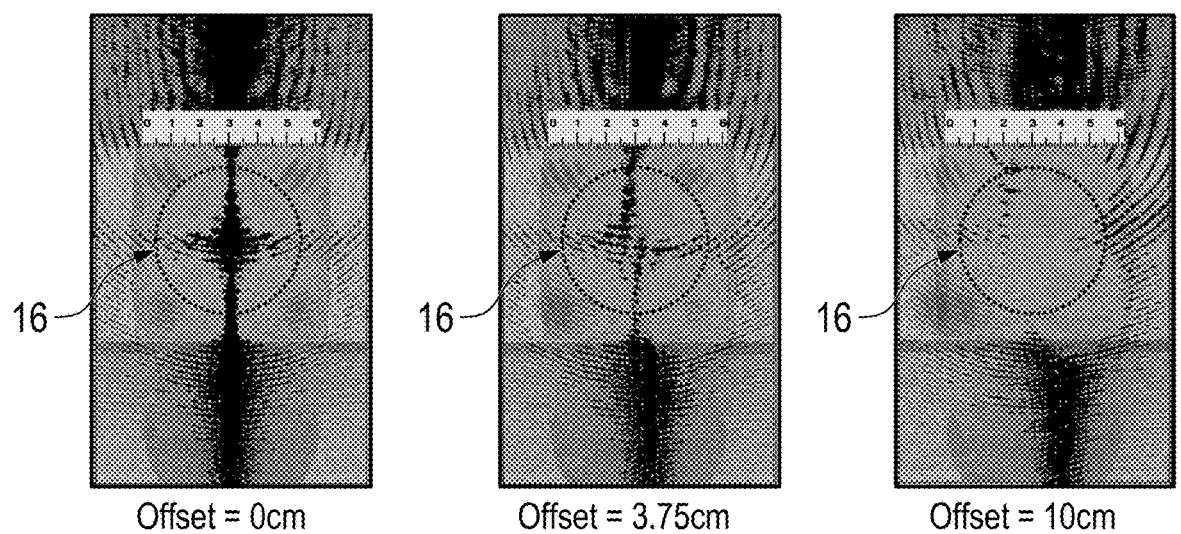
FIG. 4 schematically shows an overview of field distributions for the FR2 cross-polarization patterns indicating the influence of the offset on the field distributions.

This is also illustrated in FIGS. 3 and 4 providing overviews of the respective field distributions.

Even though a re-positioning of the device under test 12 is not necessary due to the small shift of the quiet zone, FIG. 1 shows that a positioner 42 for the device under test 12 is provided. The positioner 42 is configured to position the device under test 12 in a predetermined manner within the test location 16. In some embodiments, the positioner 42 can be used for certain test scenarios. In some embodiments, the positioner 42 includes one or more controllable linear and/or angular stages.

The OTA measurement system 10 is used for testing the device under test 12. Accordingly, the different feed antennas 24, 26, 40 may be used for generating different test signals, namely a first test signal, a second test signal and a third test signal respectively. The different test signals are associated with different frequency ranges as discussed above, thereby ensuring that the device under test 12 can be tested in a wideband range appropriately.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An over-the-air (OTA) measurement system for testing a device under test, the OTA measurement system comprising: a plurality of feed antennas, a test location for the device under test, and a reflector array with a main reflector and a sub-reflector,
the plurality of feed antennas facing the sub-reflector,
the reflector array being located such that a signal path is established between each of the plurality of feed antennas and the test location via the sub-reflector and the main reflector,
the sub-reflector having at least one focal point,
the plurality of feed antennas comprising a first feed antenna and at least one second feed antenna,
the first feed antenna being located at the at least one focal point of the sub-reflector, and
the at least one second feed antenna being located offset from the at least one focal point of the sub-reflector,
wherein the first feed antenna is configured to emit electromagnetic waves in a first frequency band, and wherein the at least one second feed antenna is configured to emit electromagnetic waves in a second frequency band, the second frequency band being different from the first frequency band.

2. The OTA measurement system of claim 1, wherein a central frequency of the first frequency band is lower than a central frequency of the second frequency band.

3. The OTA measurement system of claim 1, further comprising at least one third feed antenna, the at least one third feed antenna being located offset from the at least one focal point, wherein a distance between the at least one focal point and the at least one third feed antenna is bigger than a distance between the at least one second antenna and the at least one focal point.

4. The OTA measurement system of claim 3, wherein the at least one third feed antenna is configured to emit electromagnetic waves in a third frequency band, the third frequency band being different from the first frequency band and from the second frequency band.

5. The OTA measurement system of claim 4, wherein a central frequency of the second frequency band is higher than a central frequency of the third frequency band and/or wherein a central frequency of the first frequency band is higher than a central frequency of the third frequency band.

6. The OTA measurement system of claim 1, wherein the main reflector is located between the sub-reflector and the test location, the main reflector facing the test location and the sub-reflector such that the signal path is established between the plurality of feed antennas and the test location via the sub-reflector and the main reflector.

7. The OTA measurement system of claim 1, wherein the sub-reflector facing the plurality of feed antennas is established as a non-paraboloid reflector.

8. The OTA measurement system of claim 1, wherein the main reflector being located between the sub-reflector and the test location is established as a paraboloid reflector.

9. The OTA measurement system of claim 1, further comprising a positioner for the device under test, wherein the positioner is configured to position the device under test in a predetermined manner within the test location.

10. The OTA measurement system of claim 1, further comprising an RF-shielded chamber, the RF-shielded chamber enclosing the plurality of feed antennas, the test location for the device under test, and the reflector array.

11. The OTA measurement system of claim 1, further comprising a measurement equipment, the measurement equipment being configured to conduct OTA measurements.

12. The OTA measurement system of claim 1, wherein a quiet zone is established by the plurality of feed antennas together with the reflector array, and wherein the test location is located within the quiet zone.

13. The OTA measurement system of claim 1, further comprising the device under test, and wherein the device under test is located in the test location.

14. A method of testing a device under test over-the-air, wherein the method comprises:
providing a device under test;
providing an OTA measurement system for testing the device under test over-the-air, wherein the OTA measurement system comprises a plurality of feed antennas, a test location for the device under test, and a reflector array with a main reflector and a sub-reflector, the plurality of feed antennas facing the sub-reflector, the reflector array being located such that a signal path is established between each of the plurality of feed antennas and the test location via the sub-reflector and the main reflector, the sub-reflector having at least one focal point, the plurality of feed antennas comprising a first feed antenna and at least one second feed antenna, the first feed antenna being located at the at least one focal point of the sub-reflector, and the at least one second feed antenna being located offset from the at least one focal point of the sub-reflector;
placing the device under test at the test location; and
performing an over-the-air measurement on the device under test, wherein a first test signal is generated by the first feed antenna in a first frequency band, and wherein a second test signal is generated by the at least one second feed antenna in a second frequency band, the second frequency band being different from the first frequency band.

15. The method of claim 14, wherein a central frequency of the first frequency band is lower than a central frequency of the second frequency band.

16. The method of claim 14, wherein the OTA measurement system comprises at least one third feed antenna, the at least one third feed antenna being located offset from the at least one focal point, wherein a distance between the at least one focal point and the at least one third feed antenna is bigger than a distance between the at least one second antenna and the at least one focal point, and wherein a third test signal is generated by the at least one third feed antenna in a third frequency band, the third frequency band being different from the first frequency band and from the second frequency band.

17. The method of claim 16, wherein a central frequency of the second frequency band is higher than a central frequency of the third frequency band and/or wherein a central frequency of the first frequency band is higher than a central frequency of the third frequency band.

18. The method of claim 14, wherein the main reflector is located between the sub-reflector and the test location, the main reflector facing the test location and the sub-reflector such that the signal path is established between the plurality of feed antennas and the test location via the sub-reflector and the main reflector.

* * * * *